United States Patent
Dillinger

(10) Patent No.: US 8,483,344 B2
(45) Date of Patent: Jul. 9, 2013

(54) FAST LOCK SERIALIZER-DESERIALIZER (SERDES) ARCHITECTURE

(75) Inventor: Stephen C. Dillinger, Woodland Park, CO (US)

(73) Assignee: Stephen C. Dillinger, Woodland Park, CO (US)

( * ) Notice: Subject to any disclaimer, the term of this patent is extended or adjusted under 35 U.S.C. 154(b) by 269 days.

(21) Appl. No.: 13/159,256

(22) Filed: Jun. 13, 2011

(65) Prior Publication Data

US 2012/0314825 A1    Dec. 13, 2012

(51) Int. Cl.
*H04L 7/00* (2006.01)
*H04L 25/00* (2006.01)
*H04L 25/40* (2006.01)

(52) U.S. Cl.
USPC ........... 375/371; 375/316; 375/326; 375/327; 375/340

(58) Field of Classification Search
USPC ..................... 375/371, 316, 326, 327, 340
See application file for complete search history.

(56) References Cited

U.S. PATENT DOCUMENTS

| | | | |
|---|---|---|---|
| 4,672,639 A | 6/1987 | Tanabe et al. | |
| 4,821,297 A | 4/1989 | Bergmann et al. | |
| 4,868,514 A | 9/1989 | Azevedo et al. | |
| 4,879,720 A | 11/1989 | Shumate et al. | |
| 4,918,406 A | 4/1990 | Baumbach et al. | |
| 4,972,444 A | 11/1990 | Melrose et al. | |
| 5,043,596 A | 8/1991 | Masuda et al. | |
| 5,491,729 A | 2/1996 | Co et al. | |
| 5,561,691 A | 10/1996 | Weinraub | |
| 5,872,959 A | 2/1999 | Nguyen et al. | |
| 6,154,506 A | 11/2000 | Ishikawa et al. | |
| 6,167,077 A | 12/2000 | Ducaroir et al. | |
| 6,192,069 B1 | 2/2001 | Kubinec | |
| 6,266,799 B1 | 7/2001 | Lee et al. | |
| 6,611,219 B1 | 8/2003 | Lee et al. | |
| 6,987,825 B1 | 1/2006 | Yoshimura et al. | |
| 7,231,008 B2 | 6/2007 | Choudhury et al. | |
| 7,684,532 B2 * | 3/2010 | Aung et al. | 375/355 |
| 2002/0018444 A1 | 2/2002 | Cremin et al. | |
| 2003/0043926 A1 | 3/2003 | Terashima et al. | |
| 2003/0161430 A1 | 8/2003 | Sou | |
| 2003/0219043 A1 | 11/2003 | Doi et al. | |
| 2006/0045224 A1 * | 3/2006 | Cranford et al. | 375/355 |
| 2008/0137790 A1 * | 6/2008 | Cranford et al. | 375/357 |

* cited by examiner

*Primary Examiner* — Ted Wang

(57) ABSTRACT

A serializer-deserializer (SERDES) includes a clock-data recovery block, a control block, and a low-pass filter. The control block contains a state machine that includes a fast convergence mode utilizing an unstable operating point and a slow tracking mode utilizing a stable operating point. The control block is configured to start in the fast convergence mode to allow quickly locking the recovered clock to the incoming data stream by replicating movement commands resulting in multiple phase adjustments for each transition. To facilitate proper operation of the SERDES, the fast convergence mode is exited after N-bits and a slow tracking mode is entered to provide stable operation. The control block accepts filtered transition-data and data-transition phase state signals and converges to a phase aligned state in less than 2N-bits where N represents the number of phases in one data bit.

20 Claims, 7 Drawing Sheets

Fast Convergence State Machine

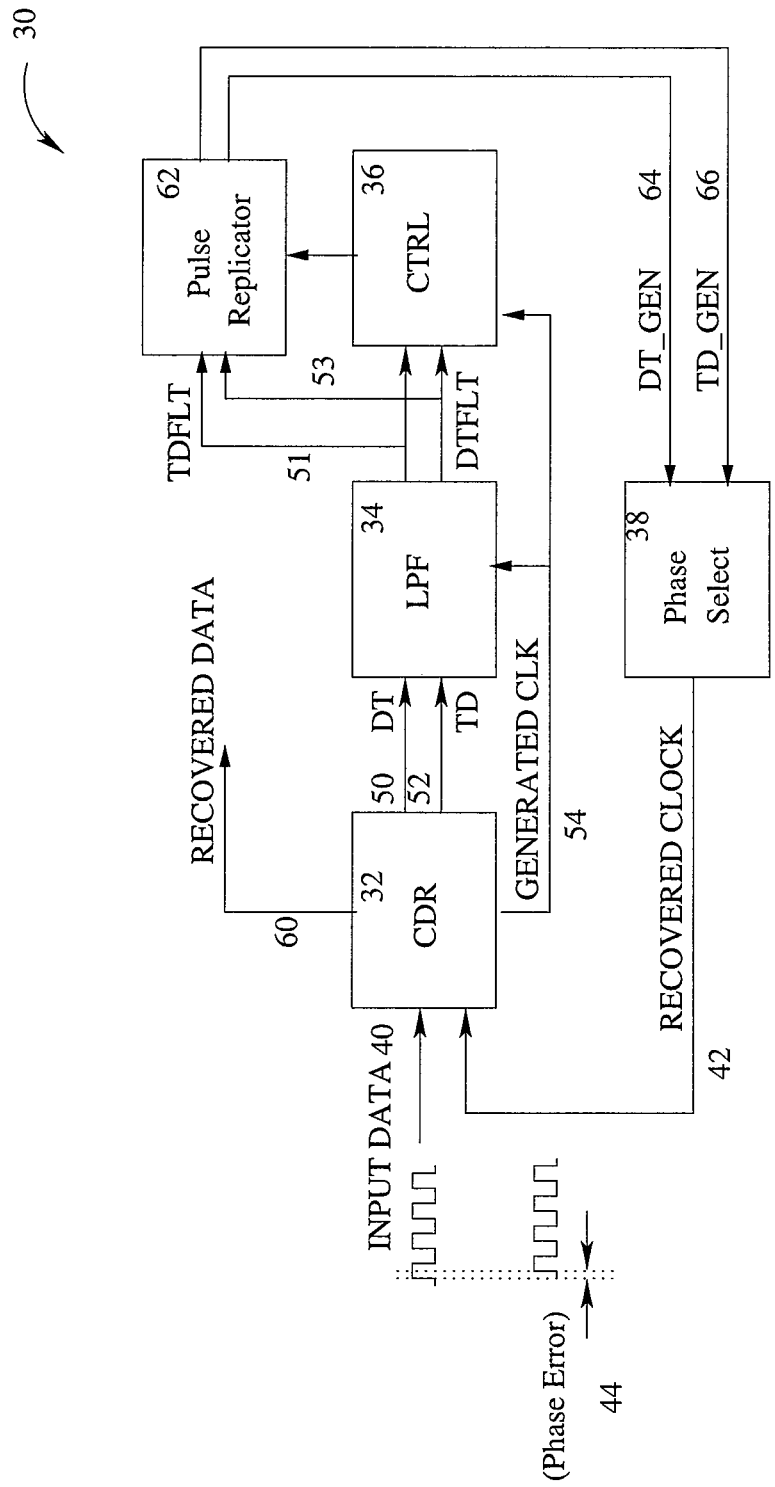
Figure 1 – SERDES Architecture

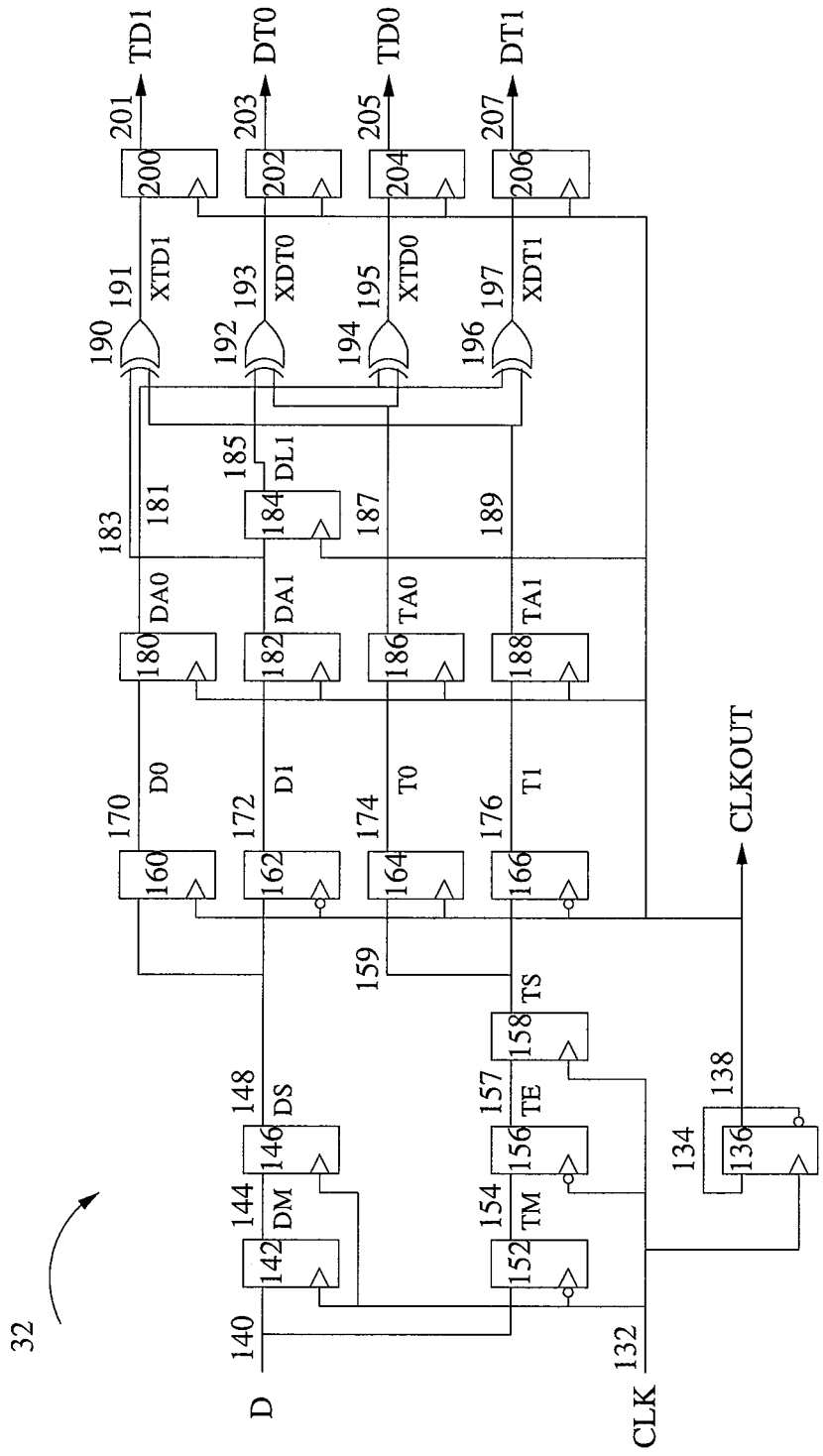
Figure 2 – CDR

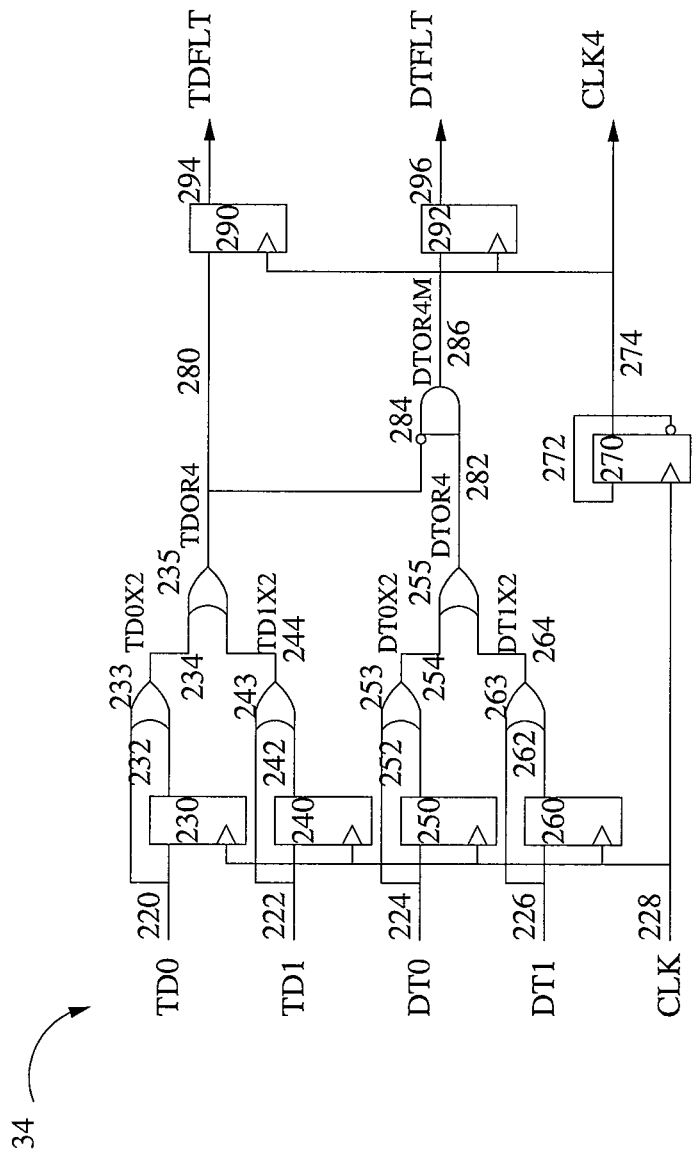
Figure 3 – Low Pass Filter (LPF)

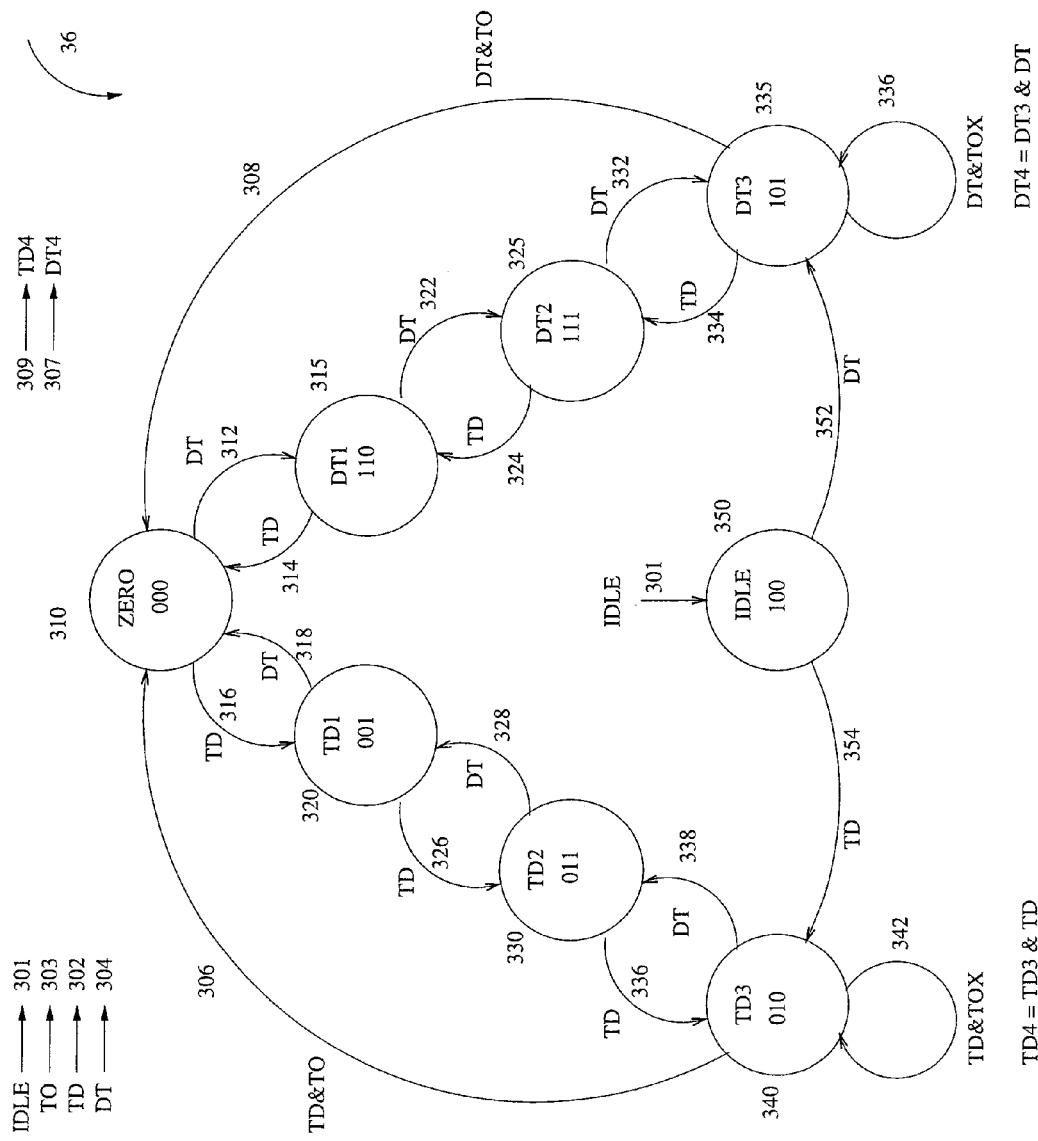
Figure 4 – Divide-by-4 Filter

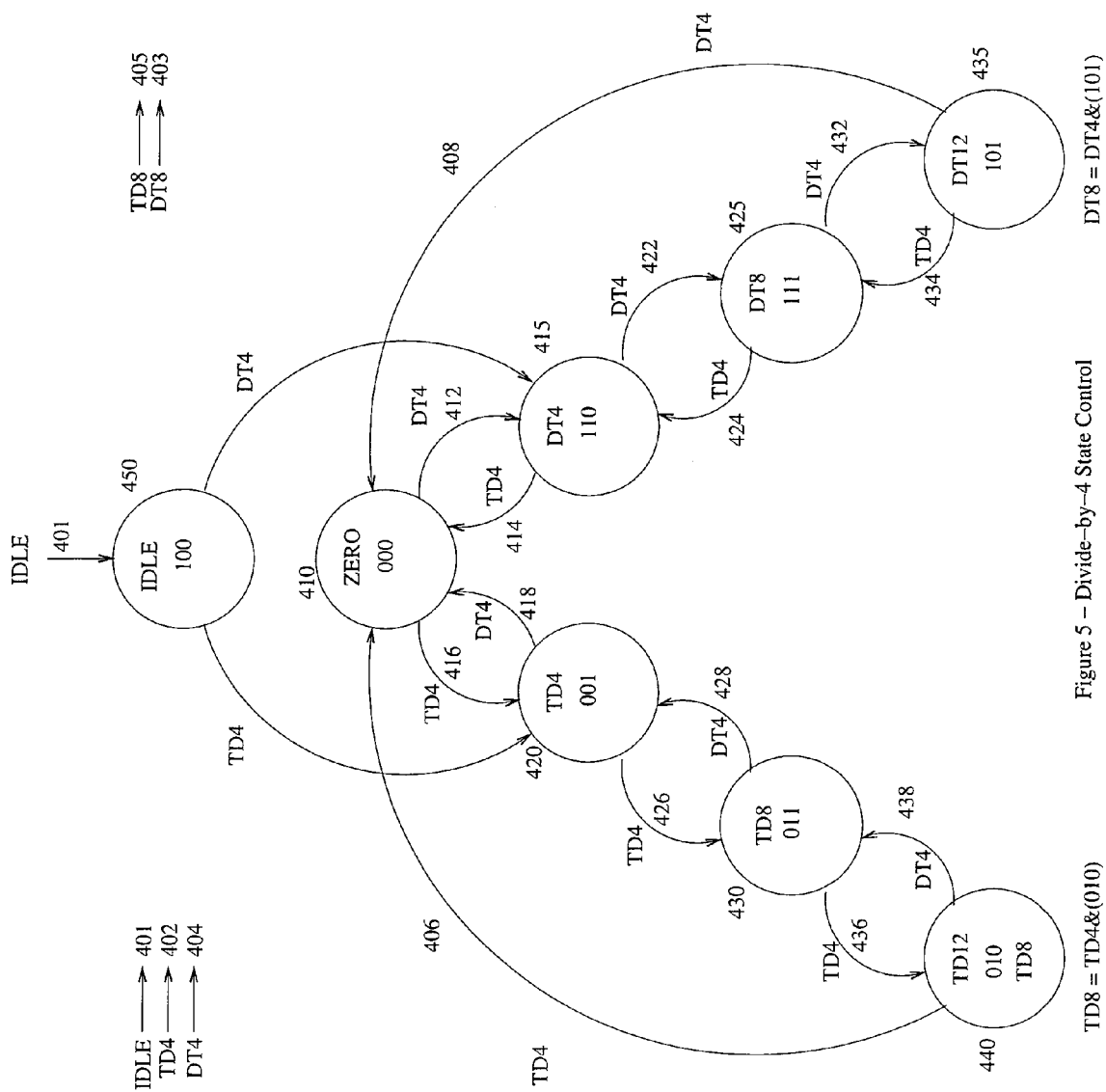
Figure 5 – Divide-by-4 State Control

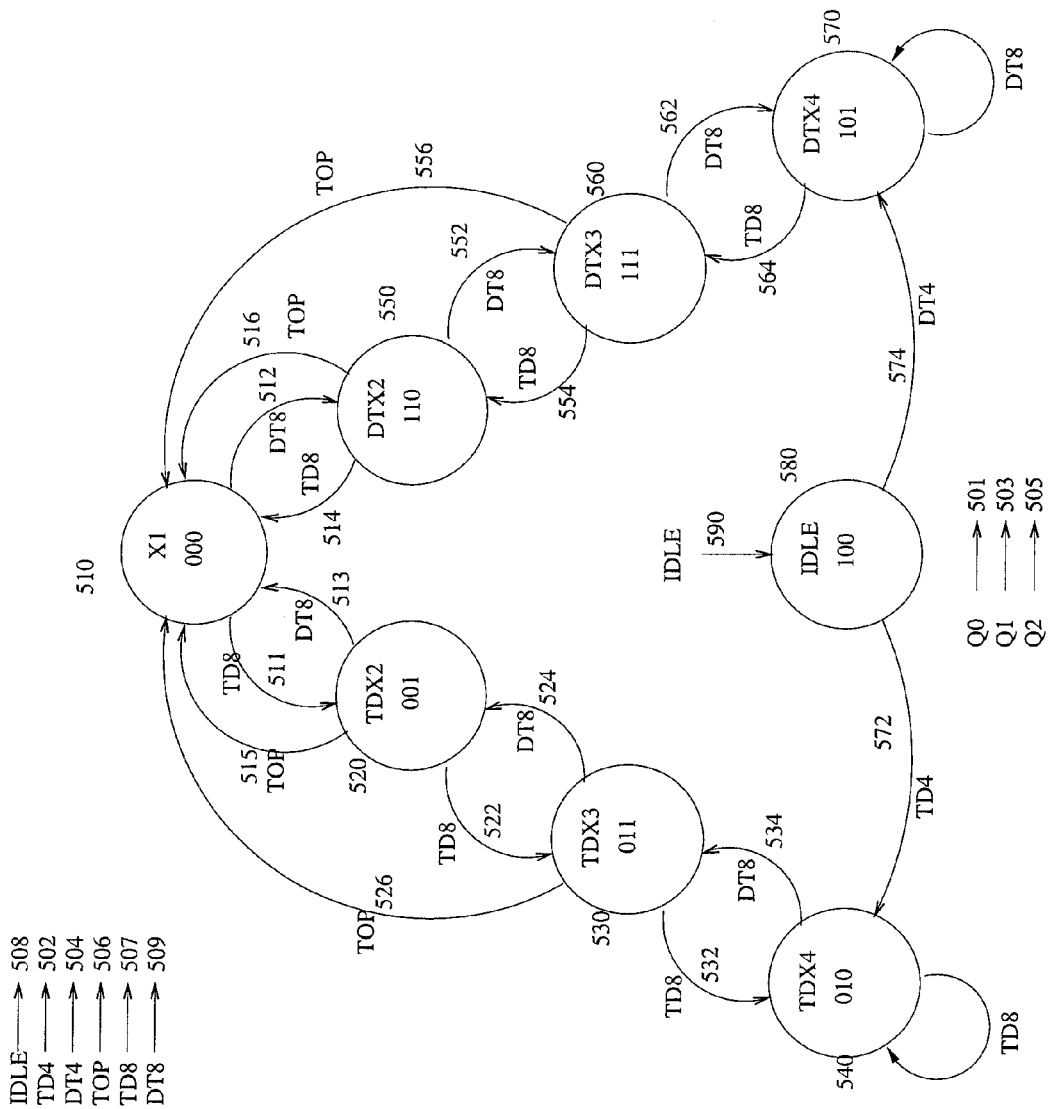
Figure 6 – Fast Convergence State Machine

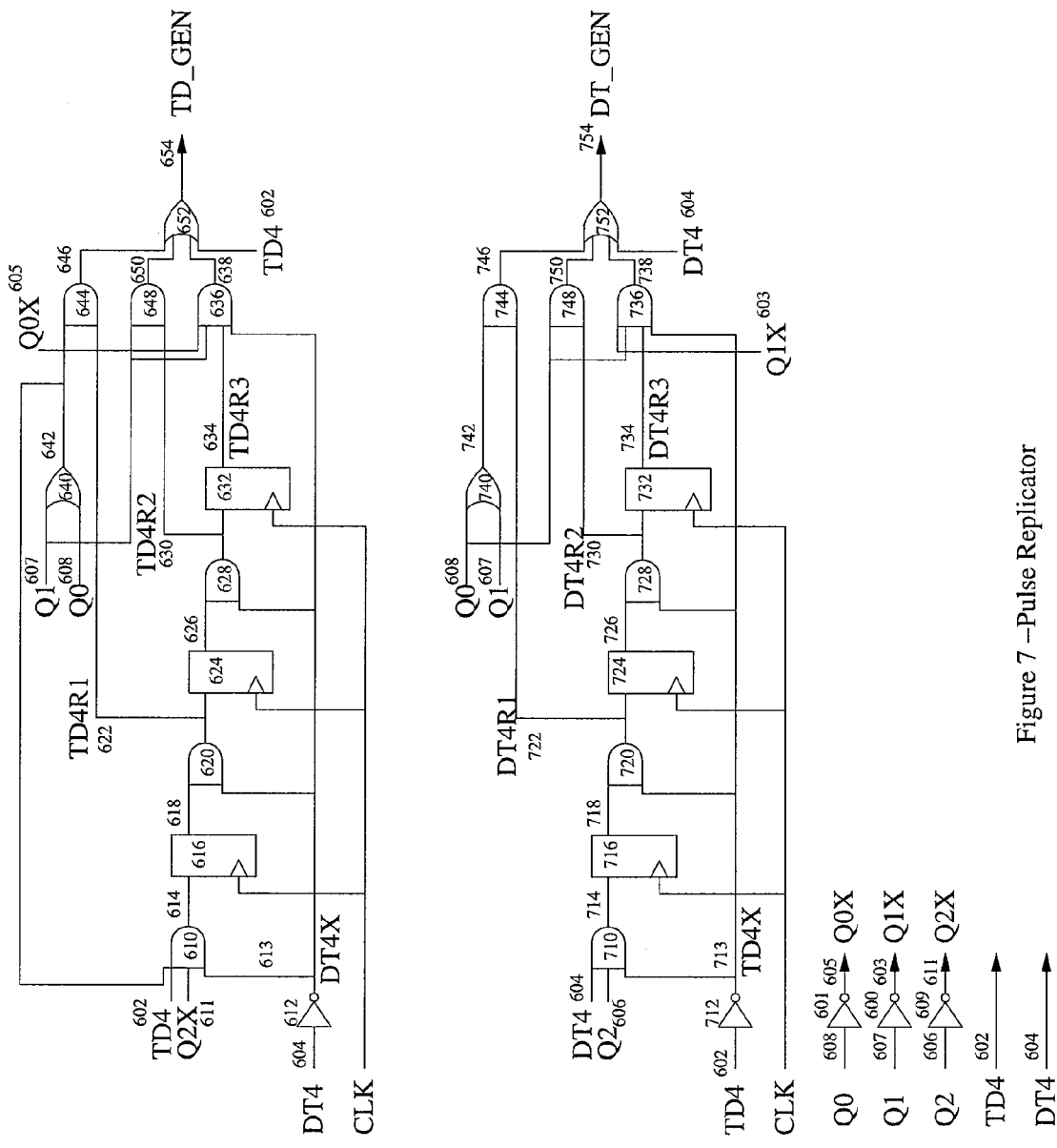
Figure 7 – Pulse Replicator

FAST LOCK SERIALIZER-DESERIALIZER (SERDES) ARCHITECTURE

BACKGROUND OF THE INVENTION

The present invention relates to serializer-deserializer (SERDES) circuits, which are known in the art. More particularly, the present invention relates to an improved SERDES circuit that provides stable, error-free operation in the presence of a non-ideal operational environment in a short period of time.

A serializer-deserializer (SERDES) is a negative feedback loop where an input phase of a clock-data recovery (CDR) block can be automatically synchronized ("locked") to the phase of a periodic input signal. The periodic input signal is commonly referred to as the recovered clock. The data tracking property of the SERDES has numerous applications in telecommunications; for example, Synchronous Optical Networks (SONET), data communications, storage technology such as Serial Attached Small Computer System Interface (SCSI) (SAS) and Serial Advanced Technology Attachment (SATA) computer storage systems, memory technology such as Dynamic Random Access Memories (DRAM) serial interfaces, and any other serial data transfer application. A basic SERDES has four components connected in a feedback loop: a CDR block, a loop filter, which is generally some implementation of a Low-Pass Filter (LPF), a Control (CTRL) block, and a phase adjustment block. Additionally, a basic SERDES includes some type of data demultiplexing to convert the higher speed serial data stream into a lower speed parallel data stream.

The CDR block is a phase detector whose function is to sample the data stream at zero-degrees (called the "transition sample") and 180-degrees (called the "data sample") and determine whether the transition sample does not match the data sample on the leading (zero-degree) sample or the trailing (360-degree) sample when there is a data transition. The sample mismatch, transition-data (TD) or data-transition (DT), detects the presence of a phase offset from the ideal locked condition. If the mismatch is TD, the data sample is skewed earlier than the ideal 180-degree position. If the mismatch is DT, the data sample is skewed later than the ideal 180-degree position.

The output of the CDR block is the sample state, TD or DT, and is used by the CTRL block to shift the operating point of the recovered clock to the in phase condition with the input data. The LPF integrates the input TD and DT pulse train and creates a lower rate output pulse train suitable for lower speed control logic. These filtered pulse trains are input to the CTRL block wherein state machines produce the phase adjust signals and determine the operating point for the phase adjust cycle. The output of the control block feeds a phase selection block which controls the phase of the recovered clock. This closes the loop for the SERDES macro and provides the negative feedback required for stable operation.

For a SERDES to lock the phase of the recovered clock to the data stream quickly, the control block needs to provide a fast adjustment rate to converge on the proper phase alignment in a minimum number of data bits. The longer the recovered clock takes to lock to the proper phase, the more data bits are lost due to the CDR block being at an incorrect sample point. To facilitate rapid convergence, a multi-rate convergence algorithm may be used to provide coarse adjustments for preliminary alignment followed by finer adjustments to complete the phase adjustment of the recovered clock to be aligned with the data stream.

The rapid convergence enables a practical implementation of a group of four such SERDES circuits, initially at zero-degree, 90-degree, 180-degree, and 270-degree sample locations, to recover any data stream without loss. The fast convergence enables small data buffers to hold the data stream until the proper error free stream can be determined. Once this data stream is detected, all data emerging from the data buffers will be error free from the initial data sample. The depth of the data buffers is less than N-bits, where N is defined as two times the number of phases in a single data bit. This quad-redundant SERDES architecture would also provide single-event upset (SEW immunity in the presence of ionizing radiation such as encountered in space applications.

Jitter tolerance is also a primary requirement for a SERDES implementation. Jitter types can cause periodically shifting transition positions (sinusoidal jitter), or a random movement of the data transition (random jitter), or the compression or expansion of the bit width due to data distortions introduced by the electronic circuitry in the data path (deterministic jitter). A SERDES must tolerate a specific amount of jitter comprised of all types to be acceptable for a particular application. One conventional approach to damping the jitter response is to require a large number of data transitions to filter jitter induced phase adjustments. This approach provides a very stable control loop but a very long lock time to align the recovered clock with the data. Alternatively, a filter may be employed to reduce the effects of jitter on the positioning of the recovered clock while allowing for a faster lock time.

Error conditions must also be accounted for in a SERDES architecture. A primary error state is a 180-degree out of phase condition being detected as "locked" by the control block when a non-ideal data stream is input. Numerous approaches have been used to eliminate this error from a SERDES implementation. Another error state is the stability and response of the SERDES to a mismatch between the data rate and the recovered clock. This data and clock frequency offset is a specification of SERDES end uses, ranging from 200 parts-per-million (ppm) to over 5000 ppm. The greater the frequency mismatch between the data and the recovered clock, the more attention stability issues must receive for proper operation in the presence of jitter.

Implementations of SERDES designs range from analog control loops built around a Phase Locked Loop (PLL) phase detector which are very stable but have a very slow response time, to all digital approaches, which can have fast response times but can be more susceptible to noise effects. The primary requirement of any SERDES is a phase detector to monitor the phase relationship between the data stream and the recovered clock. Once the phase error is detected, the clock and data must have a mechanism to enable aligning one with the other.

As is described further in the "Detailed Description" section below, a SERDES design must provide stable, error-free operation in the presence of a non-ideal operational environment.

SUMMARY OF THE INVENTION

According to the present invention, a serializer-deserializer (SERDES) includes a clock-data recovery (CDR) block having an input data path sampled on both rising edges and falling edges of a recovered clock configured to output a relative phase relationship between a clock and input data; a control (CTRL) block having a state machine configured to operate at an unstable point during initial convergence to an in phase condition when the state machine shifts to operating in a stable configuration; a low-pass filter (LPF) configured to accept single-bit pulses over an interval defined by a divide-by-N clock and output an OR-ed combination of N-bits to accomplish a filtering function; and a phase adjust block configured to control a phase adjust function for a phase controlled clock.

The LPF block accumulates pulses from the phase detector and averages the aggregate movement by stretching the single pulse output from the phase detector into a single pulse in a slower clock domain. To eliminate a 180-degree lock up condition due to conflicting movement commands, the LPF block biases the phase adjustment to prioritize one adjustment direction over the other when both occur simultaneously.

The CTRL block receives the LPF output and generates phase adjust select outputs based on the phase relationship of the data and clock. The overall latency from input data sample to phase adjust must be less than the phase adjust rate for stable operation. To accelerate convergence to an optimal sample point the CTRL block dynamically switches between an unstable operating point and a stable operating point. This forces a faster rate of convergence compared to a standard serializer-deserializer implementation.

The CTRL block contains state machines that include a fast convergence mode utilizing an unstable operating point when coupled with a pulse replicator block, and a slow tracking mode utilizing a stable operating point to filter out random direction changes where the phase adjust occurs at a divide-by-N rate, where the divide-by-N rate is slower than a loop delay from the data input to phase adjust result. The CTRL block is configured to start in the fast convergence mode to allow quickly locking the recovered clock to the incoming data stream by replicating movement commands resulting in recovered clock phase adjustments at a divide-by-N rate, where the divide-by-N rate is one-fourth of a data rate. To facilitate proper operation of the SERDES the unstable fast convergence mode is exited after a selectable number of bits chosen to limit the amount of phase adjust to half of a total bit width and a slow tracking mode is entered to provide stable operation. The CTRL block accepts filtered phase state signals and converges to a phase aligned state in a lock time less than N-bits, where N is twice the number of phase steps in a single bit period.

Fast convergence enables applications in Dynamic Random Access Memory (DRAM), wherein a data stream from the DRAM may be in any phase orientation and recovered during a data retrieval stage and operate as a synchronized serial data link when a data transfer is ready to occur. The fast convergence time is such that synchronized data is available at the SERDES output prior to initial data being presented at the output of a typical synchronizing first-in, first-out (FIFO) register file. This fast convergence enables four instantiations of this embodiment, initially set to a zero-degree, a 90-degree, a 180-degree, and a 270-degree sample point, to instantly recover error free data with no synchronization period required.

BRIEF DESCRIPTION OF THE DRAWINGS

Embodiments of the present invention are better understood with reference to the following drawings. Like reference numerals designate corresponding similar parts.

FIG. 1 is a block diagram of the SERDES architecture displaying all component parts with their proper connectivity as modified according to the present embodiments;

FIG. 2 is a schematic diagram of the clock-data recovery (CDR) block depicting an Alexander or Bang-bang phase detector according to the present embodiments;

FIG. 3 is a schematic diagram illustrating one exemplary embodiment of a low-pass filter with pulse stretching according to the present embodiments;

FIG. 4 is a state diagram illustrating the control block LPF divider algorithm state machine according to the present embodiments;

FIG. 5 is a state diagram illustrating the state machine to control the pulse replication state machine depicted in FIG. 6 according to the present embodiments;

FIG. 6 is a state diagram illustrating the pulse replication state machine operation as illustrated in FIG. 1 according to the present embodiments; and FIG. 7 is a schematic diagram illustrating one potential implementation of the pulse replication function as illustrated in FIG. 1 according to the present embodiments.

DETAILED DESCRIPTION

In the following Detailed Description reference is made to the accompanying drawings, which form a part hereof and in which is shown, by way of illustration, specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration only and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

FIG. 1 is a block diagram illustrating one example of a conventional serializer-deserializer (SERDES) 30, but the blocks are further modified for improved performance according to the present invention as described in further detail below. SERDES 30 includes a clock-data recovery block (CDR) 32, a low-pass filter (LPF) 34, a control block (CTRL) 36, a phase select block 38, and a pulse replicator block 62. The input data 40 enters the CDR 32 with an undetermined phase error 44 and is sampled by the full-rate recovered clock 42. The output of the CDR 32 is a sample of the phase relationship between data and the recovered clock represented by Transition-Data (TD) 52 and Data-Transition (DT) 50. In addition, the CDR 32 outputs a recovered clock 54 which may be a divided down version of the full rate recovered clock 42 or a full rate copy of the recovered clock 42. This generated recovered clock 54 and derivatives of it are used to drive circuitry in LPF 34, CTRL 36, and the pulse replicator 62. The recovered data 60 is also output from the CDR 32 and forwarded along with the generated recovered clock 54.

The LPF 34 receives the TD 52 and DT 50 signals and the generated recovered clock 54 from the CDR 32. Both TD 52 and DT 50 are filtered to stretch single-bit pulses out to the entire generated recovered clock 54 period. This pulse stretching keeps all data but reduces the transition density to accumulate phase adjust commands in CTRL 36. The LPF 34 outputs are pulses on TD Filtered (TDFLT) 51 and DT Filtered (DTFLT) 53. Not all possible output combinations are valid, both TDFLT 51 and DTFLT 53 may be deasserted, TDFLT 51 may be asserted with DTFLT 53 deasserted, or TDFLT 51 may be deasserted and DTFLT 53 asserted. If both TDFLT 51 and DTFLT 53 occur in the CDR 32, one of the conflicting pulses is filtered out in the LPF 34. The state combinations of TDFLT 51 and DTFLT 53 are decoded in CTRL 36.

CTRL 36 receives the filtered TDFLT 51 and DTFLT 53 signals along with a copy of the generated recovered clock 54. Using these inputs, the state machines illustrated in FIG. 4, FIG. 5, and FIG. 6 interoperate in CTRL 36 to determine the proper direction to shift the recovered clock 42 to properly phase align the input data 40 and the recovered clock 42. The idle case is with neither TDFLT 51 or DTFLT 53 asserted. In this case, the internal state of CTRL 36 remains unchanged pending a transition. If only one of TDFLT 51 or DTFLT 53 is asserted, the state machine in CTRL 36 will direct the phase of the recovered clock 42 to be shifted in the proper direction to move closer to the optimal sample point. The degenerate case is if both TDFLT 51 and DTFLT 53 are asserted. In this case the movement direction is ambiguous, commanding a shift in opposite directions simultaneously. In the presence of deterministic jitter, this case can cause a lock up state exactly 180 degrees out of phase from which a SERDES 30 may not recover. To prevent this condition from occurring, a bias is introduced by the LPF 34 that preferentially asserts either TDFLT 51 or DTFLT 53 when both movement directions are commanded. This eliminates the possibility of the SERDES 30 operating incorrectly.

When CTRL 36 is starting from an unlocked condition, the rate of adjustment is equal to the rate of the LPF 34 outputs. This adjustment rate is faster than the latency through the entire control loop so it is too frequent to provide a stable operating point, but it will allow the initial convergence to be much more rapid than using a stable adjustment rate. Once K-steps are taken, where "K" is selectable for best convergence for the given application, CTRL 36 automatically shifts to the stable operating mode for final convergence. The outputs from CTRL 36 are used to modify the operating point of the pulse replicator 62 to output the phase shift commands DT_GEN 64 and TD_GEN 66, referred to here as "up" and "down," respectively. These phase shift commands are fed to the phase shift selector and move the recovered clock in the proper direction to optimally sample the input data.

The phase select 38 may be any implementation that allows shifting the phase of the recovered clock by N steps per one clock period. It may be constructed using multiplexers, phase mixers, etc. The details of the phase select 38 are immaterial to the claims in this invention. Input commands are up and down, and they shift the phase of the recovered clock by one increment for each up or down command.

FIG. 2 is the schematic of a clock-data recovery (CDR) 32 block for a half-rate architecture. The incoming data, D 140, is sampled by both the rising and falling edges of the recovered clock CLK 132 into registers 142 and 152. The sampled data is forwarded using signals DM 144 and TM 154 and re-sampled by registers 146 and 156. To align the transition sample path, a register 158 reclocks TE 157 to generate TS 159. The output of these registers, DS 148 and TS 159, is then split into two data paths that operate at half the data rate. The demultiplexed data is captured into registers 160, 162, 164, and 166 and output onto signals D0 170, D1 172, T0 174, and T1 176.

To capture the half-rate signals requires a divide-by-2 version of the recovered clock 132 that is created by the toggle circuit using register 136 with negative feedback 134. This negative feedback 134 creates an output that inverts the state with each rising edge of the recovered clock 132, which generates a new clock with half the frequency of the input recovered clock 132. The new clock, CLKOUT 138, is used to drive the half rate data paths and all subsequent circuitry at half the frequency of the full rate recovered clock.

To align the four data eye samples into the same clock domain edge requires a second rank of synchronizing registers, 180, 182, 186, and 188. These registers resample the demultiplexed data and create four aligned data samples, DA0 181, DA1 183, TA0 187, and TA1 189. To create the fifth sample needed for testing four regions, the DA1 183 is resampled by register 184 to create DL1 185. Logically, the register differences are detected by:

XTD1 191=DA1 XOR 190 TA1
XDT1 197=DA0 XOR 196 TA1
XTD0 195=DA0 XOR 194 TA0
XDT0 193=DL1 XOR 192 TA0

These four XOR gates 190, 192, 194, and 196 completely map two incoming data eyes and generate up to three possible movement commands to be used to adjust the phase of the recovered clock. An XOR logic gate asserts one of two binary logic states, if either input, but not both inputs, are true the output is true, otherwise the output is false. The outputs of the XOR gates are reclocked by a register bank, XTD1 191 is reclocked by register 200 to create the output TD1 201, XDT1 197 is reclocked by register 206 to create the output DT1 207, XTD0 195 is reclocked by register 204 to create the output TD0 205, and XDT0 193 is reclocked by register 202 to create the output DT0 203.

FIG. 3 is a schematic diagram of an integrating low-pass filter (LPF) 34 with pulse stretching implementation. The input data comes from the CDR, two data-transition streams, DT0 224, and DT1 226, and two transition-data streams, TD0 220, and TD1 222. Each of these inputs is captured into a register to double the pulse width, so TD0 220 is captured into register 230 and the output 232 is combined with the TD0 220 input in an OR gate 233. An OR logic gate asserts one of two binary logic states, true or false, if either input is true the output is true, otherwise the output is false. The OR gate 233 output, TD0X2 234, is now a doubled pulse. A similar process occurs with TD1 222 and register 240, which generates the delayed sample 242 for OR gate 243 to create a double wide version of TD1 222. These two OR gate outputs, TD0X2 234 and TD1X2 244 are further combined in an OR gate 235 to create a TD pulse four cycles wide on TDOR4 280.

For the data-transition streams, an identical pulse stretching circuit is employed.

The input DT0 224 is captured by register 250 and the input DT0 224 and the captured input 252 are input to an OR gate 253 to double the pulse width on output DT0X2 254. For DT1 226, a register 260 captures the input generating the delayed sample 262, and OR gate 263 doubles the pulse width output on DT1X2 264. The double wide pulses, DT0X2 254 and DT1X2 264 are further combined in an OR gate 255 to create an output pulse DTOR4 282 that is up to four times wider than the input pulse.

The two filtered pulse signals, TDOR4 280 and DTOR4 282, are the filtered outputs, but to prevent the occurrence of simultaneous commands to move in opposite directions, the DTOR4 282 pulse is blocked in the event that a TDOR4 280 pulse is asserted by passing the inverse of TDOR4 280 into an AND gate 284. An AND logic gate asserts one of two binary logic states, true or false, if both inputs are true the output is true, otherwise the output is false. The output of this AND gate 284 is DTOR4M 286, the filtered and qualified output that will never be active at the same time as TDOR4 280.

The final output registers re-time the OR gate outputs. TDOR4 280 is reclocked by a register 290 that produces output TDFLT 294, and DTOR4M is reclocked by a register 292 that produces output DTFLT 296. These two outputs are the filtered outputs that are used to determine the direction to shift the phase of the recovered clock.

The final element of the LPF 34 is a clock divider that matches the clock rate of the output registers to the pulse doubled move commands. To divide the input, CLK 228 uses a simple D-type flip flop 270 that connects the inverted output back to the input 272 and the divide-by-two clock output CLK4 274 is used to clock the output registers and the CTRL block.

FIG. 4 is one implementation 36 of a control block for an LPF divider algorithm state machine that implements a divide-by-four filtering algorithm to be utilized in the present invention. The state transitions are controlled by the outputs of the LPF block 34 detailed in FIG. 3. The ZERO state 310 is the starting point for the accumulation of four pulses from either TDFLT 51 or DTFLT 53 in FIG. 1 as output from the LPF block 34 of FIG. 3.

For an operational state where TD 302 pulses are incoming to center the data sample, the state machine will transition from ZERO 310 to TD1 320 based on the TD transition 316 occurring. From state TD1 320, if a DT 304 occurs the state machine will transition back to ZERO 310 based on the DT transition 318. If a TD 302 occurs in state TD1 320, then the state machine transitions to state TD2 330 based on the TD transition 326. Once in state TD2 330, the state machine can transition back to state TD1 320 if a DT transition 328 occurs, or it can transition to state TD3 340 based on a TD transition 336. When the state machine is in state TD3 340, the occurrence of a DT 304 will return the state machine to state TD2 330 based on the DT transition 338. If the SERDES is locked and operating in tracking mode as determined by the state of input TO 303, the occurrence of a TD & TO transition 306 will return the state machine to state ZERO 310 and generate a TD4 309 output. If TO 303 has not been asserted, indicating the state machine is in convergence mode, a TD transition 342 will keep the state machine in state TD3 340 and generate a TD4 309 output.

For an operational state where DT 304 pulses are incoming to center the data sample, the state machine will transition from ZERO 310 to DT1 315 based on the DT transition 312 occurring. From state DT1 315 if a TD 302 occurs the state machine will transition back to ZERO 310 based on the TD transition 314. If a DT 304 occurs in state DT1 315, then the state machine transitions to state DT2 325 based on the DT transition 322. Once in state DT2 325, the state machine can transition back to state DT1 315 if a TD transition 324 occurs, or it can transition to state DT3 335 based on DT transition 332. When the state machine is in state DT3 335, the occurrence of a TD 302 will return the state machine to state DT2 325 based on the TD transition 334. If the SERDES is locked and operating in tracking mode as determined by the state of input TO 303, the occurrence of a DT & TO transition 308 will return the state machine to state ZERO 310 and generate a DT4 307 output. If TO 303 has not been asserted, indicating the state machine is in convergence mode, a DT transition 336 will keep the state machine in state DT3 335 and generate a DT4 307 output.

If there are no transitions on the inputs the IDLE input 301 is asserted. This forces the state machine into IDLE state 350 where it stays until a transition on either TD 302 or DT 304 occurs. A TD transition 354 moves the state machine to state TD3 340 directly where accelerated convergence mode operation commences. A DT transition 352 moves the state machine to state DT3 335 directly where normal convergence mode operation commences. The occurrence of an IDLE input 301 forces the state machine to transition to the IDLE state 350 on the next clock regardless of the current state and remain until activity on either TD 302 or DT 304 begins a new convergence cycle.

FIG. 5 is one implementation of a state diagram that controls the pulse replication state machine that implements a simple divide-by-four filtering algorithm to be utilized in the present embodiments. The state transitions are controlled by the outputs of the divide-by-four state machine block detailed in FIG. 4. The ZERO state 410 is the starting point for the accumulation of four pulses from either TD4 402 or DT4 404 as output from the divide-by-four state machine.

From the ZERO state 410, a TD4 transition 416 moves the state machine to state TD4 420. The state machine waits in this state until either a DT4 transition 418 returns it to the ZERO state 410, or a TD4 transition 426 moves it to state TD8 430. The state machine waits in state TD8 430 until either a DT4 transition 428 returns it to state TD4 420, or a TD4 transition 436 moves it to state TD12 440. The state machine waits in state TD12 440 until either a DT4 transition 438 returns it to state TD8 430, or a TD4 transition 406 moves it to state ZERO 410. The occurrence of a TD4 402 while in state TD12 440 also generates a TD8 output pulse 405.

From the ZERO state 410, a DT4 transition 412 moves the state machine to state DT4 415. The state machine waits in this state until either a TD4 transition 414 returns it to the ZERO state 410, or a DT4 transition 422 moves it to state DT8 425. The state machine waits in state DT8 425 until either a TD4 transition 424 returns it to state DT4 415, or a DT4 transition 432 moves it to state DT12 435. The state machine waits in state DT12 435 until either a TD4 transition 434 returns it to state DT8 425, or a DT4 transition 408 moves it to state ZERO 410. The occurrence of a DT4 404 while in state DT12 435 also generates a DT8 output pulse.

The IDLE state 450 is similar in function to the ZERO state 410. When the IDLE input 401 is asserted, the IDLE state 450 is entered until either a DT4 404 or TD4 402 causes a state transition to state DT4 415 or state TD4 420, respectively.

FIG. 6 is one implementation of a state diagram that implements the pulse replication function that enables the fast convergence that is captured in this invention. The state transitions are controlled by the outputs, TD8 507 and DT8 509, of the simple divide-by-four filtering state machine of FIG. 5, the divide-by-four state machine block, the IDLE status 508, and the pulse time out signal, TOP 506 controlled transition from convergence mode to tracking mode. The outputs of this state machine, Q0 501, Q1 503, and Q2 505, control the phase replication for the recovered clock.

The initial state is the IDLE state 580. This state enables the fast convergence mode. If a TD4 502 occurs, the state machine exits the IDLE state 580 and transitions 572 to state TDX4 540. This state enables the quadrupling of the TD4 pulse 502 which in turn causes the accelerated convergence mode of operation. While operating in convergence mode, the state machine will remain in state TDX4 540 until an IDLE transition 590 occurs. This causes a transition to the IDLE state 580, or a DT8 transition 534 occurs, causing a transition to state TDX3 530.

If the state machine is in state TDX3 530 a TD8 transition 532 causes it to transition to state TDX4 540, a DT8 transition 524 causes it to transition to state TDX2 520, an IDLE transition 590 causes a transition to the IDLE state 580, and a TOP transition 526 causes a transition to state X1 510. This indicates a change from convergence mode to tracking mode.

If the state machine is in state TDX2 520, a TD8 transition 522 causes it to transition to state TDX3 530, a DT8 transition 513 causes it to transition to state X1 510, an IDLE transition 590 causes a transition to the IDLE state 580, and a TOP transition 515 causes a transition to state X1 510. This indicates a change from convergence mode to tracking mode.

From the initial state, the IDLE state 580, if a DT4 504 occurs, the state machine exits the IDLE state 580 and transitions 574 to state DTX4 570. This state enables the quadrupling of the DT4 pulse 504, which in turn causes the accelerated convergence mode of operation. While operating in convergence mode, the state machine will remain in state DTX4 570 until an IDLE transition 590 occurs which causes a transition to the IDLE state 580, or a TD8 transition 564 occurs which causes a transition to state DTX3 560.

If the state machine is in state DTX3 560, a DT8 transition 562 causes it to transition to state DTX4 570, a TD8 transition 554 causes it to transition to state DTX2 550, an IDLE transition 590 causes a transition to the IDLE state 580, and a TOP transition 556 causes a transition to state X1 510, indicating a change from convergence mode to tracking mode.

If the state machine is in state DTX2 550, a DT8 transition 552 causes it to transition to state DTX3 560, a TD8 transition 514 causes it to transition to state X1 510, an IDLE transition 590 causes a transition to the IDLE state 580, and a TOP transition 516 causes a transition to state X1 510, indicating a change from convergence mode to tracking mode.

In state X1 510 a TD8 transition 511 causes it to transition to state TDX2 520, a DT8 transition 512 causes it to transition to state DTX2 550, and an IDLE transition 590 causes a transition to the IDLE state 580.

When the state machine is in state X1 510, a single TD4 502 or DT4 504 pulse will only generate a single output pulse. This non-multiplied pulse rate limits the rate the SERDES can track to 1953 ppm if there are 32 sub-divisions of a single recovered clock period. The pulse replication mode allows tracking at four times this rate, or 7812 ppm when in state TDX4 540 or DTX4 570.

FIG. 7 is one implementation of a pulse replication function, in this case the incoming pulse, TD4 602 or DT4 604 can be repeated up to three times creating an output pulse four cycles long from a single input pulse. This replication accelerates the convergence by a factor of four when the control circuitry is operating at one fourth the data rate. The inputs to the pulse replicator are TD4 602 from the LPF 34 in FIG. 1, DT4 604 from the LPF 34, and Q2 606, Q1 607, and Q0 608 from the pulse replication state machine depicted in FIG. 6. TD4 602 passes through an inverter 712 to create TD4X 713. An inverter logic gate asserts one of two binary logic states, if the input is true the output is false, if the input is false the output is true. DT4 604 passes through an inverter 612 to create DT4X 613. Q1 607 passes through an inverter 600 to create Q1X 603. Q0 608 passes through an inverter 601 to create Q0X 605. Inverter 609 receives Q2 606 at node 601 and generates Q2X at node 611.

The replication circuits for TD4 602 and DT4 604 are similar but not identical. To replicate TD4 602, it is input to an AND gate 610 and combined with Q1 OR 640, Q0 642, Q2X 611, and DT4X 613. The generated signal 614 is the input signal to be replicated and the state in the replication state machine that enables the pulse repetition as long as the opposing phase adjust direction is not present. This signal is reclocked by a D-flip-flop 616 that creates a delayed copy 618 of the signal being replicated. This signal passes through another AND 620 that qualifies it with DT4X 613 to stop replication if a change in direction occurs. This creates the first replicated pulse, TD4R1 622.

TD4R1 622 is reclocked by a D-flip-flop 624 to create a second delayed copy 626 of the signal being replicated. This signal passes through another AND 628 that qualifies it with DT4X 613 to stop replication if a change in direction occurs. This creates the second replicated pulse, TD4R2 630.

TD4R2 630 is reclocked by a D-flip-flop 632 to create a third delayed copy of the signal being replicated, TD4R3 634. This signal passes through another AND 636 that qualifies it with DT4X 613 to stop replication if a direction change occurs. To limit the cases where TD4R1 622 is active it is input to an AND 644 that is qualified by the output of an OR 640 of Q1 607 and Q0 608. This OR-AND combination enables the first copy for states TDX2, TDX3 and TDX4 from the pulse replication state machine in FIG. 5. To limit the cases where TD4R2 630 is active it is input to an AND 648 that qualifies it with Q1 607. To limit the cases where TD4R3 634 is active, it is input to an AND 636 that qualifies it with Q0X 605, DT4X 613, and Q1 607. The TD4R1 622 AND 644 output 646, the TD4R2 630 AND 648 output 650, and the TD4R3 634 AND 636 output 638 are input to an OR 652 with the input pulse TD4 602 to create the output pulse TDGEN 654 that is a copy of TD4 602 replicated up to four times.

To replicate DT4 604 it is input to an AND gate 710 and combined with Q2 606 and TD4X 713. The generated signal 714 is the input signal to be replicated and the state in the replication state machine that enables the pulse repetition as long as the opposing phase adjust direction is not present. This signal is reclocked by a D-flip-flop 716 that creates a delayed copy 718 of the signal 714 being replicated. This signal passes through another AND 720 that qualifies it with TD4X 713 to stop replication if a change in direction occurs. This creates the first replicated pulse, DT4R1 722.

DT4R1 722 is reclocked by a D-flip-flop 724 to create a second delayed copy 726 of the signal being replicated. This signal passes through another AND 728 that qualifies it with TD4X 713 to stop replication if a direction change occurs. This creates the second replicated pulse, DT4R2 730.

DT4R2 730 is reclocked by a D-flip-flop 732 to create a third delayed copy, DT4R3 734 of the signal being replicated. To limit the cases where DT4R1 722 is active, it is input to an AND 744 that is qualified by the output 742 of an OR 740 of Q1 607 and Q0 608. This OR-AND combination enables the first copy for states DTX2, DTX3 and DTX4 from the pulse replication state machine in FIG. 5. To limit the cases where DT4R2 730 is active it is input to an AND 748 that qualifies it with Q0 608. To limit the cases where DT4R3 734 is active, it is input to an AND 736 that qualifies it with Q0 608, Q1X 603, and TD4X 713. The DT4R1 722 AND 744 output 746, the DT4R2 730 AND 748 output 750, and the DT4R3 734 AND 736 output 738 are input to an OR 752 with the input pulse DT4 604 to create the output pulse DTGEN 754 that is replicated up to four times.

Although specific embodiments in accordance with the invention have been described and illustrated, the invention is not limited to the specific forms and arrangements of parts so described and illustrated. The invention is limited only by the claims.

What is claimed is:

1. A serializer-deserializer (SERDES) comprising:
  a clock-data recovery (CDR) block having an input data path sampled on both rising and falling edges of a recovered clock configured to output a relative phase relationship between the recovered clock and input data;
  a control (CTRL) block having a state machine configured to operate at an unstable point during initial convergence to an in phase condition when the state machine shifts to operating in a stable configuration;
  a low-pass filter (LPF) coupled between the CDR block and the CTRL block configured to accept single-bit pulses over an interval defined by a divide-by-N clock and output an OR-ed combination of N-bits to accomplish a filtering function; and a phase adjust (PA) block coupled between the CDR block and the CTRL block configured to control a phase adjustment function which aligns an input data sample with a phase controlled clock (sample clock).

2. The SERDES of claim 1, wherein the LPF biases the phase adjustment function such that one adjustment direction has priority over the other to eliminate 180-degree lock up conditions.

3. The SERDES of claim 1, wherein the CTRL block comprises a state machine that accumulates change history to filter out random direction changes.

4. The SERDES of claim 1, wherein an unlocked condition adjusts a recovered clock phase at a divide-by-N rate, where the divide-by-N rate is one-fourth of a data rate.

5. The SERDES of claim 1, wherein a locked condition adjusts a recovered clock phase at a divide-by-N rate, where the divide-by-N rate is slower than a loop delay from a data input to phase adjust.

6. The SERDES of claim 1, wherein a number of steps during unstable operation is limited to less than half of a total bit width.

7. The SERDES of claim 1, wherein lock time as defined by a number of bits to totally lock is less than N-bits, where N represents a number of phases in one data bit.

8. The SERDES of claim 1, wherein the LPF accumulates pulses over an interval to determine a phase relationship between the recovered clock and input data.

9. The SERDES of claim 1, wherein the input data originates from a Dynamic Random Access Memory (DRAM), and wherein a corresponding data stream from the DRAM may be in any phase orientation and recovered during a data retrieval stage and operate as a synchronized serial data link between the DRAM and the SERDES.

10. The SERDES of claim 1, wherein the input data is buffered in a synchronizing first-in, first-out (FIFO) register file of a depth sufficient to insure the input data is synchronized prior to initial data retrieval from the FIFO register file.

11. The SERDES of claim 1, wherein the SERDES is replicated four or more times at a zero-degree, a 90-degree, a 180-degree, and a 270-degree phase location to place one CDR block in an error free location allowing lossless data synchronization to a data stream.

12. A serializer-deserializer (SERDES) comprising:
a clock-data recovery (CDR) block having a data input, a recovered clock input, and an output;
a control (CTRL) block having a state machine configured to operate at an unstable point during convergence to an in phase condition when the state machine shifts to operating in a stable configuration;
a low-pass filter (LPF) coupled between the CDR block and the CTRL block; and
a phase adjust (PA) block coupled between the CDR block and the CTRL block for providing a recovered clock to the recovered clock input of the CDR block.

13. The SERDES of claim 12, wherein the LPF substantially eliminates 180-degree lock up conditions.

14. The SERDES of claim 12, wherein the CTRL state machine accumulates change history to filter out random direction changes.

15. The SERDES of claim 12, wherein an unlocked condition adjusts a recovered clock phase at a divide-by-N rate, where the rate is one-fourth of the data rate.

16. The SERDES of claim 12, wherein a locked condition adjusts a recovered clock phase at a divide-by-N rate, where the divide-by-N rate is slower than a loop delay from the data input to phase adjust.

17. A serializer-deserializer (SERDES) comprising:
a clock-data recovery (CDR) block;
a control (CTRL) block;
a low-pass filter (LPF) coupled between the CDR block and the CTRL block; and
a phase select block coupled between the CDR block and the CTRL block,
wherein the CTRL block contains a state machine that includes a fast convergence mode utilizing an unstable operating point and a slow tracking mode utilizing a stable operating point.

18. The SERDES of claim 17, wherein the CTRL block is configured to start in the fast convergence mode to allow quick locking of a recovered clock to an incoming data stream by replicating movement commands resulting in multiple phase adjustments for each transition.

19. The SERDES of claim 17, wherein the fast convergence mode is exited to facilitate proper operation of the SERDES after an initial N-bit sample length and the slow tracking mode is entered to provide stable operation.

20. The SERDES of claim 17, wherein the CTRL block accepts filtered transition-data (TD) phase state signals and data-transition (DT) phase state signals and converges to a phase aligned state in less than 2N-bits, where N represents a number of phases in one data bit.

\* \* \* \* \*